United States Patent [19]
Zhang

[11] Patent Number: 6,091,295
[45] Date of Patent: Jul. 18, 2000

[54] PREDISTORTION TO IMPROVE LINEARITY OF AN AMPLIFIER

[75] Inventor: Xiangdong Zhang, Nashua, N.H.

[73] Assignee: The Whitaker Corporation, Wilmington, Del.

[21] Appl. No.: 08/884,424

[22] Filed: Jun. 27, 1997

[51] Int. Cl.[7] .................................................. H03F 1/26
[52] U.S. Cl. .......................................... 330/149; 330/307
[58] Field of Search ................................. 330/149, 307, 330/311

[56] References Cited

U.S. PATENT DOCUMENTS

| | | | |
|---|---|---|---|
| 4,992,754 | 2/1991 | Blauvelt et al. | 330/149 |
| 5,119,392 | 6/1992 | Childs | 330/149 X |
| 5,132,639 | 7/1992 | Blauvelt et al. | 330/149 |
| 5,221,908 | 6/1993 | Katz et al. | 330/149 |
| 5,252,930 | 10/1993 | Blauvelt | 330/149 |
| 5,436,749 | 7/1995 | Pidgeon, Jr. et al. | 359/161 |
| 5,451,906 | 9/1995 | Kaltenecker | 330/292 |
| 5,703,530 | 12/1997 | Sato et al. | 330/149 |
| 5,714,903 | 2/1998 | Bruccoleri et al. | 327/359 |
| 5,808,511 | 9/1998 | Kobayashi | 330/149 |

*Primary Examiner*—Steven J. Mottola

[57] ABSTRACT

An amplifier (1) of improved linearity has a predistortion, bipolar junction device (4), and a transistor (2) on an input side of the amplifier (1), the bipolar junction device (4) being smaller in size than the transistor (2), and having its bipolar junction of opposite polarity with that of the transistor (2), to cancel distortion in an output of the first stage transistor (2).

11 Claims, 3 Drawing Sheets

PREDISTORTION TO IMPROVE LINEARITY OF AN AMPLIFIER

FIELD OF THE INVENTION

The invention relates to an amplifier, and, more particularly to an amplifier presented with predistortion to improve linearity of the amplifier.

BACKGROUND OF THE INVENTION

A known amplifier of cascode, single side, configuration is known from U.S. Pat. No. 5,451,906, and comprises, an emitter common transistor at an input side of the amplifier, coupled to a base common transistor at an output side of the amplifier. Nonlinearity of the amplifier is measured by a decline in the ratio of the output power to the input power, over the frequency range of the RF signal to be amplified by the amplifier. The known amplifier has improved linearity at an upper end of its frequency range, due to placement of an inductor between the transistor at the output side of the amplifier and a feedback circuit. The inductor is coupled to a collector of the common base transistor. Return loss stability of the known amplifier is achieved, due to a base bias capacitor at the base of the transistor at the output side of the known amplifier.

SUMMARY OF THE INVENTION

According to the invention, linearity of an amplifier over an extended frequency and power range of an RF signal is improved as a result of predistortion at an input side of the amplifier. Nonlinearity of the amplifier is considered to arise from distortion presented by a transistor at an input side of an amplifier. According to an embodiment of the amplifier, predistortion of opposite polarity cancels the distortion presented by the transistor at the input side to improve linearity of the amplifier over an extended frequency and power range.

The predistortion is of opposite polarity relative to distortion presented by the transistor at the input side of an amplifier. The predistortion is presented by a source of small size and low power dissipation, which is suitable for the base bias circuit coupled to the transistor.

For example, the source of predistortion comprises a transistor that is as small as one-sixteenth of the size of the transistor at the input side of the amplifier, which allows the source to be suitable for the base bias circuit of the transistor at the input side of the amplifier.

According to an embodiment of the invention, the source of predistortion is a transistor fabricated together with the first stage transistor and a remainder of the amplifier on a common semiconductor, substrate, for example, semi-insulating GaAs, which enables unitary and consistent circuit construction by MMIC fabrication techniques for control over impedance and phase. According to another embodiment of the invention, the source of predistortion is a diode fabricated together with the first stage transistor and a remainder of the amplifier on a common semiconductor substrate, for example, semi-insulating GaAs, which enables unitary and consistent circuit construction by MMIC fabrication techniques for control over impedance and phase.

According to an embodiment, the transistor at an input side of the amplifier comprises, a first stage transistor at an input side of an amplifier coupled to a remainder of the amplifier. A remainder of the amplifier is considered as a second stage, transistor at an output side of the amplifier.

Embodiments of the invention will now be described by way of example with reference to the accompanying drawings, according to which:

DETAILED DESCRIPTION

Figure 1:
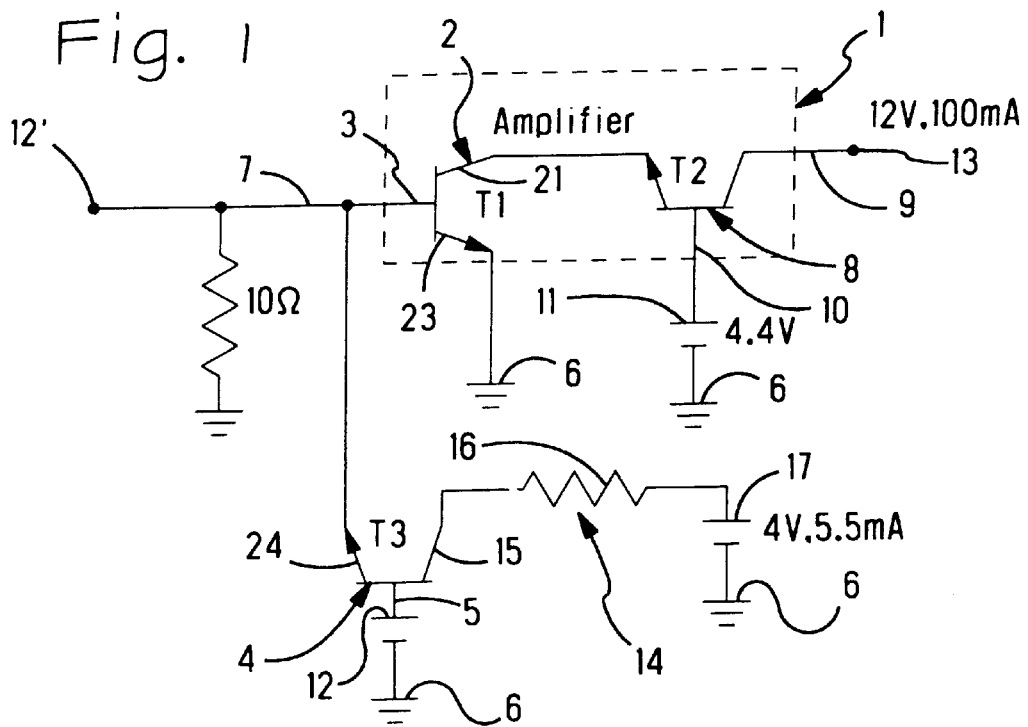
FIG. 1 is a schematic diagram of an amplifier with a predistortion circuit.

With reference to FIG. 1, an amplifier 1 comprises, a first stage transistor 2 amplifying an RF signal applied to an input of the first stage transistor 2. For example, the input comprises a base 3 of the first stage transistor 2. A predistortion transistor 4 is coupled to the base 3 of the first stage transistor 2. The predistortion transistor 4 is a common base transistor 4, by its base 5 being coupled to common at 6.

With reference to FIG. 1, the first stage transistor 2 comprises a first transistor 2 at an input side 7 of the amplifier 1, coupled to a second transistor 8 at an output side 9 of the amplifier 1. The amplifier 1 of FIG. 1 is a one side push pull, cascode amplifier 1 with the first transistor 2 being a common emitter transistor 2, and the second transistor 8 being a common base transistor 8, which forms a one side, cascode amplifier 1, referenced to common at 6. A base 10 of the second transistor 8 is coupled to common at 6 through a small capacitor 11 to improve stability of operation. A similar small capacitor 12 couples the base 5 of the predistortion transistor 4 to common 6. For example, the one side cascode amplifier 1 can be repeated by transistors of opposite polarity, not shown, in a balanced cascode amplifier construction, wherein each balanced side of the balanced cascode amplifier construction is referenced to common at 6.

In FIG. 1, the input side 7 is referenced at an input terminal 12. The output side 9 is referenced at an output terminal 13. According to an embodiment, the transistor 2 at an input side 7 of the amplifier 1 is considered as comprising, a first stage transistor 2, at the input side 7. The first stage transistor 2 is coupled to a remainder of the amplifier 1, considered as being the second transistor 8 comprising, a second stage, transistor 8 at an output side 9 of the amplifier 1.

With reference to FIG. 1 a predistortion 14 circuit of the amplifier 1, for improving linearity of the amplifier 1, will now be described. The predistortion circuit 14 comprises, the predistortion transistor 4 coupled to and supplying an input side 7 of the amplifier 1. A collector 15 of the common base, predistortion transistor 4 is coupled through a series resistor 16 and a series capacitor 17 to common at 6.

The predistortion transistor 4 is smaller in size as compared with that of the first stage transistor 2. The predistortion transistor 4 has its base-emitter junction being of opposite polarity as compared with that of the transistor 2 at the input side of the amplifier 1. Input current, supplied at the input side 7, is split by the transistor 2 and the predistortion transistor 4. Each of the transistors 2 and the transistor 4 produces nonlinear distortion of the input RF signal. The distortion due the transistor 4 is presented as predistortion at the input side 7 of the amplifier 1. The transistor 4 has a base-emitter junction of opposite polarity with that of the transistor 2. Accordingly, the predistortion, when amplified by the transistor 2, cancels the distortion due to the transistor 2. The predistortion supplied by the predistortion transistor 4 becomes amplified by the first stage transistor 2 to cancel an equal and opposite distortion in an amplified output from the first stage transistor 2. An amplifier 1 of improved linearity results.

The predistortion is presented by a source of small size and low power consumption, which is suitable for the base bias circuit of the transistor 2. As shown in FIG. 1, the predistortion circuit 14 is coupled to the base 3 of the transistor 2.

Figure 5:
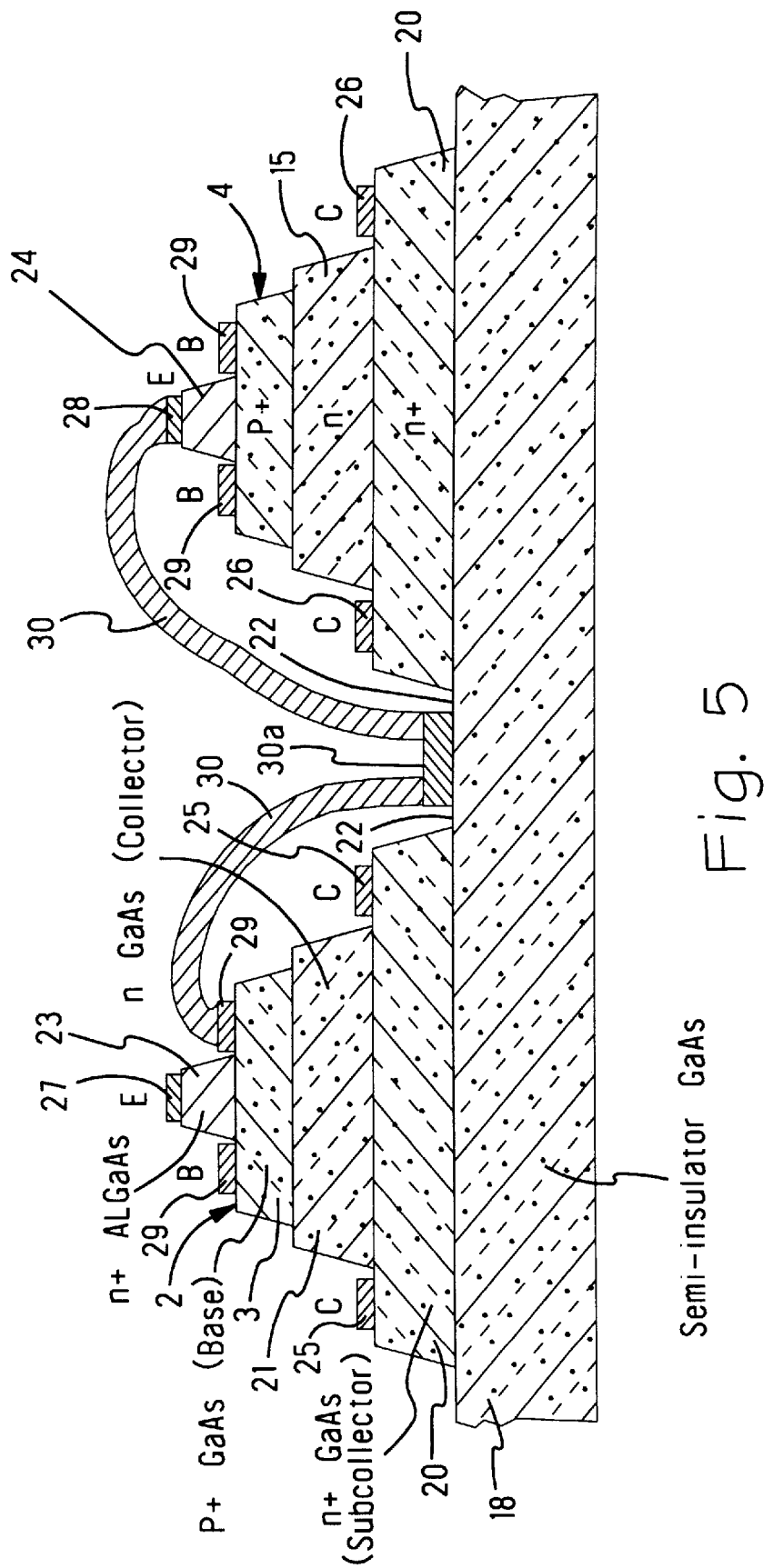
FIG. 5 is a diagram of a cross section of a predistortion circuit and a first stage transistor of an amplifier of semiconductor construction.

An embodiment of the invention will now be discussed with reference to FIG. 5. A bipolar junction device in the form of the predistortion transistor 4 is fabricated together with the first stage transistor 2 and the transistor 4 of the amplifier 1 on a common semiconductor, which enables consistent circuit construction by HBT MMIC fabrication techniques for control over impedance and phase. For example, FIG. 5 depicts the semiconductor constructed as doped mesa structures residing in successive, layers of the mesa structures on a semi-insulator 18, for example, a substrate of semi-insulating GaAs. Separate η+ doped areas comprising subcollectors 20, for relative high conductivity, underlie a common plane of η doped GaAs areas corresponding to the collectors 15, 21 for the predistortion transistor 4 and the first stage transistor 2, as shown in FIG. 1. The η and η+ doped areas are separated by gaps 22 that provide electrical isolation of the transistors 2 and 4.

Further P+ doped areas in a common plane comprise respective bases 3,5 of the respective transistors 2, 4. Further η+ doped AlGaAs areas comprise the respective emitters 23, 24 of the transistors 2, 4, and form respective bipolar junctions with the underlying bases 3, 5 of the transistors 2, 4. The areas comprising the collectors 15, 21 form bipolar junctions with the bases 3, 5. Conducting collector contacts 25, 26 for respective collectors 15, 21 are on respective subcollectors 20. Conducting emitter contacts 27, 28 are on respective emitters 23, 24. Conducting electrical base contacts 29 are on respective bases 3, 5. Conducting connections of overlay metal 30 join the emitter contact 28 of the predistortion transistor 4 with one of the base contacts 29 of the first stage transistor 2, the connections of overlay metal 30 being joined to a common contact area 30a on the substrate 18. For the purposes of illustration, the sizes and shapes of the transistors 2, 4 are not to scale, nor are adjustments in their sizes and shapes being shown to provide the electrical values for phase adjustment, impedance selection, and the electrical values for the resistor 16 and the capacitors 11, 12, 17.

Figure 4:
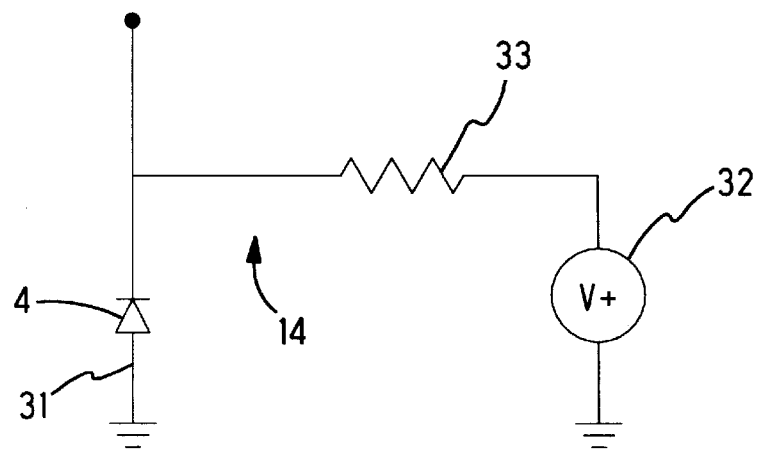
FIG. 4 is a schematic diagram of another embodiment of a predistortion circuit.

With reference to FIG. 4, an alternative embodiment of the predistortion circuit 14 comprises a bipolar junction device 4 in the form of a predistortion diode 4. An electrode 31 of the diode 4 coupled to the base 3 of the first stage transistor 2 at the input side 7 of the amplifier 1. A diode 4 requires a bias provided by a DC voltage source 32 coupled through a resistor 33. The diode 4 is of sufficient small size and small power conversion inefficiency to reside in the base biasing circuit of the transistor 2 at the input side 7 of the amplifier 1. The diode 4 can be fabricated together with the first stage transistor 2 on a common semiconductor, similar to the semiconductor 18. For example, the diode 4 is a bipolar junction device, as is the predistortion transistor 4. A bipolar junction device 4 is readily constructed on the semiconductor 18 of FIG. 5, either as a single junction structure for the diode 4, or as two junctions, one for a base-collector junction and a second for an base-emitter junction, of the predistortion transistor 4.

Figure 2:
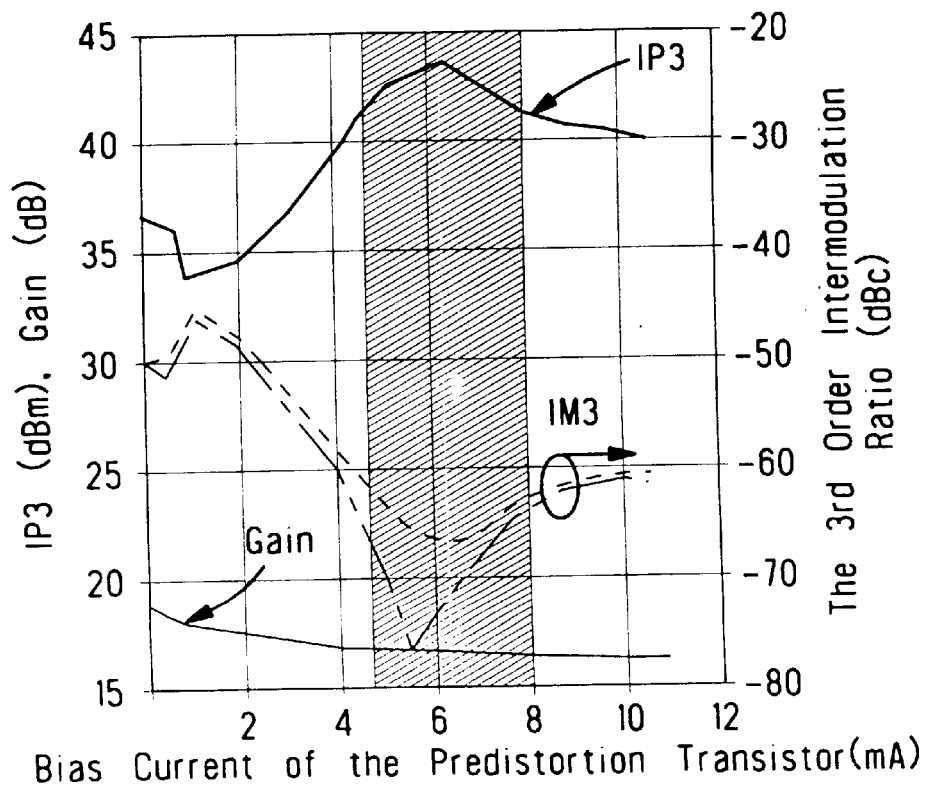
FIG. 2 is a graph of gain and third order intermodulation distortion versus bias current of a predistortion transistor in the predistortion circuit as shown in FIG. 1.

According to an embodiment as shown in FIG. 1, an amplifier of 50 Ohms characteristic impedance produces an amplified output of 12 Volts, at 100 milliamps. The size of the transistor T3, comprising the predistortion transistor 4, is one-sixteenth of the size of the transistor T1, comprising the first stage transistor 2, at the input side 7 of the amplifier 1. The predistortion circuit 14 provides 4 Volts, at 5.5 milliamps for the predistortion transistor 4. With reference to FIG. 2, the gain, IP3, is plotted as a function of the bias current of the predistortion transistor T3 at 800 MHz. The shaded area highlights a range of the highest IP3 as the most desirable range of operation. The gain of the overall amplifier 1 is also plotted. Also plotted is the two-tone, third order intermodulation ratio, IM3.

Figure 3:
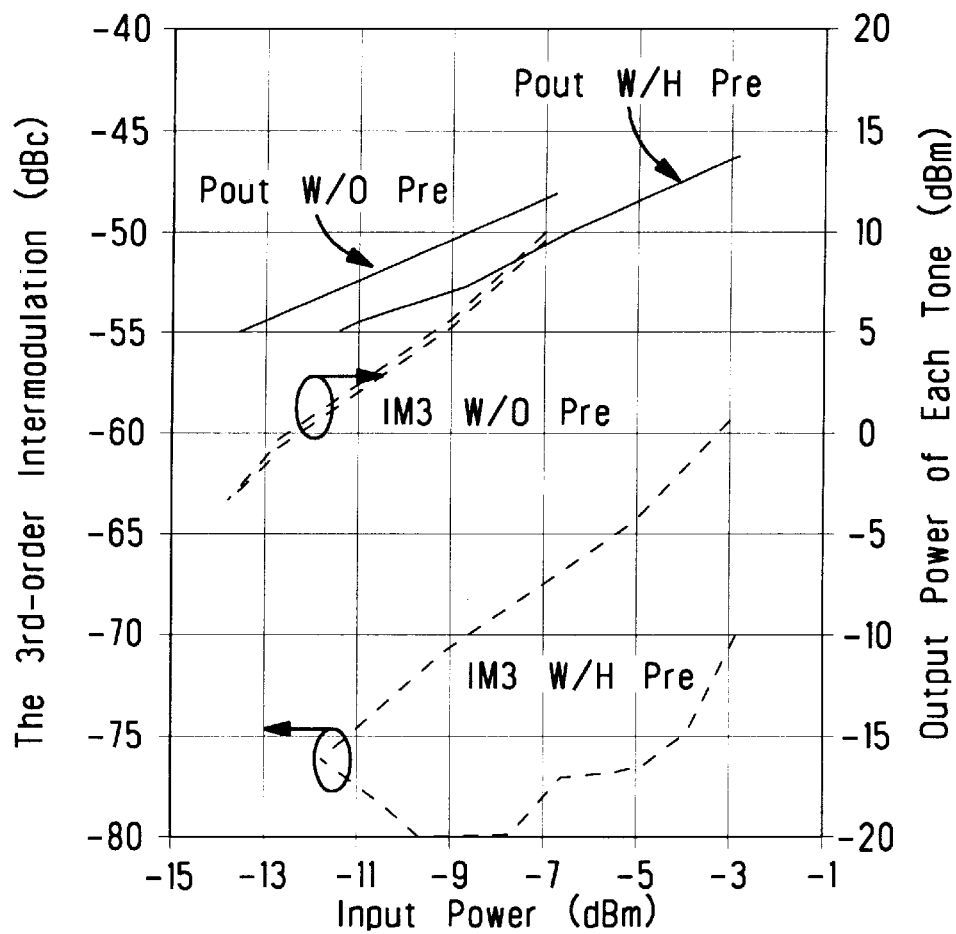
FIG. 3 is a graph of third order intermodulation distortion and output power versus input power for both, a first stage transistor of an amplifier without a predistortion transistor, and the first stage transistor with a predistortion transistor.

With reference to FIG. 3, the third order intermodulation ratio, IM3, of the first stage transistor 2 of the amplifier 1 is plotted against the input power and the corresponding output power of the amplifier 1. Without the predistortion transistor 4, the corresponding graph of the distortion, IM3 W/O Pre, is higher than the distortion, IM3 W/H Pre, with the predistortion transistor 4 present in the amplifier 1. Thus linearity of the amplifier 1 is improved by the predistortion transistor 4 in the amplifier 1. With further reference to FIG. 3, without the predistortion transistor 4 being present in the amplifier 1, the output power, Pout W/O Pre, of the first stage transistor 2 is plotted, and then is compared with the output power, Pout W/H Pre, with the predistortion transistor 4 present in the amplifier 1. The amplifier gain is reduced insignificantly by the presence of the predistortion transistor 4. The power consumption of the predistortion transistor 4 is shown to be insignificant, due to the relative small size as compared with that of the first stage transistor 2 of the amplifier 1. For example, a predistortion transistor 4, or other bipolar junction device, is of a relative size in a range of 5% to 10% of the size of the first stage transistor 2, which allows the source to be suitable for the base bias circuit of the transistor 2 at the input side 7 of the amplifier 1.

Although embodiments of the invention have been disclosed, other embodiments and modifications of the invention are intended to be covered by the spirit and scope of the appended claims.

What is claimed is:

1. A circuit for improving linearity of an amplifier, comprising: a predistortion transistor, an emitter of the predistortion transistor connecting to an input side of a first stage transistor of an amplifier, and wherein, distortion of an amplified output of the first stage transistor is cancelled by amplified distortion from the predistortion transistor supplied to the input side of the first stage transistor, wherein a base, collector and emitter of the predistortion transistor are in respective planes of a semiconductor, and are together with the base, collector and emitter of the first stage transistor in said respective planes.

2. A circuit for improving linearity of an amplifier, comprising: a predistortion transistor, an emitter of the predistortion transistor connecting to an input side of a first stage transistor of an amplifier, and wherein, distortion of an amplified output of the first stage transistor is cancelled by amplified distortion from the predistortion transistor supplied to the input side of the first stage transistor, wherein the predistortion transistor is a common base transistor.

3. A circuit as recited in any one of claims 1 and 2, wherein the predistortion transistor is smaller in size than the first stage transistor to reduce power dissipation in the amplified output.

4. A circuit as recited in any one of claims 1 and 2, wherein the first stage transistor is a common emitter transistor, and said first stage transistor is coupled to a second stage transistor, wherein said second stage transistor is a common base transistor.

5. A circuit as recited in any one of claims 1 and 2, wherein a size of the predistortion transistor is in the range of 5% to 10% of the size of the first stage transistor.

6. An amplifier of improved linearity, comprising: a first stage transistor and a predistortion transistor having base-emitter junctions of opposite polarities, the predistortion transistor being smaller in size than the first stage transistor, the predistortion transistor supplying an input of the first stage transistor to cancel distortion in an output of the first stage transistor.

7. An amplifier as recited in claim 6 wherein, the, predistortion transistor is a common base transistor.

8. A circuit as recited in claim 6 wherein, the first stage transistor is a common emitter transistor.

9. An amplifier as recited in claim 6 wherein, a size of the predistortion transistor is in a range of 5% to 10% of the size of the first stage transistor.

10. An amplifier as recited in claim 6 wherein, the predistortion transistor and at least the first stage transistor are together on a semiconductor.

11. An amplifier of improved linearity comprising: a first stage transistor of the amplifier having a base-emitter junction of one polarity, and a predistortion bipolar junction device having a bipolar junction of opposite polarity to that of the base-emitter junction of the first stage transistor, and said bipolar junction device supplying an input of the first stage transistor to be amplified and to cancel distortion in an output of the first stage transistor.

* * * * *